(12) United States Patent
Obuchi et al.

(10) Patent No.: US 10,549,514 B2
(45) Date of Patent: Feb. 4, 2020

(54) OPTICAL FILM

(71) Applicant: ZEON CORPORATION, Chiyoda-ku, Tokyo (JP)

(72) Inventors: Kazuyuki Obuchi, Tokyo (JP); Taku Hatano, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 25 days.

(21) Appl. No.: 15/560,255

(22) PCT Filed: Mar. 22, 2016

(86) PCT No.: PCT/JP2016/059034
§ 371 (c)(1),
(2) Date: Sep. 21, 2017

(87) PCT Pub. No.: WO2016/152871
PCT Pub. Date: Sep. 29, 2016

(65) Prior Publication Data
US 2018/0065348 A1 Mar. 8, 2018

(30) Foreign Application Priority Data

Mar. 25, 2015 (JP) ................... 2015-062150

(51) Int. Cl.
| | | |
|---|---|---|
| *B32B 27/32* | (2006.01) | |
| *B32B 25/04* | (2006.01) | |
| *B32B 25/14* | (2006.01) | |
| *B32B 27/22* | (2006.01) | |
| *B32B 25/16* | (2006.01) | |
| *B32B 27/24* | (2006.01) | |
| *B32B 25/08* | (2006.01) | |
| *B32B 7/04* | (2019.01) | |
| *C08L 53/02* | (2006.01) | |
| *H05B 33/02* | (2006.01) | |
| *B32B 27/28* | (2006.01) | |
| *B32B 27/20* | (2006.01) | |
| *B32B 15/06* | (2006.01) | |
| *B32B 27/30* | (2006.01) | |
| *H01L 51/52* | (2006.01) | |
| *B32B 7/02* | (2019.01) | |
| *C08F 8/04* | (2006.01) | |
| *C08F 297/04* | (2006.01) | |
| *G02B 5/30* | (2006.01) | |

(52) U.S. Cl.
CPC .............. *B32B 27/285* (2013.01); *B32B 7/02* (2013.01); *B32B 7/04* (2013.01); *B32B 15/06* (2013.01); *B32B 25/04* (2013.01); *B32B 25/08* (2013.01); *B32B 25/14* (2013.01); *B32B 25/16* (2013.01); *B32B 27/20* (2013.01); *B32B 27/22* (2013.01); *B32B 27/24* (2013.01); *B32B 27/30* (2013.01); *B32B 27/302* (2013.01); *B32B 27/32* (2013.01); *B32B 27/325* (2013.01); *C08F 8/04* (2013.01); *C08F 297/046* (2013.01); *C08L 53/02* (2013.01); *H01L 51/5237* (2013.01); *H01L 51/5253* (2013.01); *H01L 51/5281* (2013.01); *H05B 33/02* (2013.01); *B32B 27/281* (2013.01); *B32B 2250/03* (2013.01); *B32B 2250/40* (2013.01); *B32B 2270/00* (2013.01); *B32B 2307/21* (2013.01); *B32B 2307/306* (2013.01); *B32B 2307/308* (2013.01); *B32B 2307/4026* (2013.01); *B32B 2307/412* (2013.01); *B32B 2307/51* (2013.01); *B32B 2307/546* (2013.01); *B32B 2307/71* (2013.01); *B32B 2307/7246* (2013.01); *B32B 2307/732* (2013.01); *B32B 2405/00* (2013.01); *B32B 2457/206* (2013.01); *G02B 5/30* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 6,965,003 B2 * | 11/2005 | Sone | ............ C08F 297/04 525/338 |
| 8,537,309 B2 | 9/2013 | Toyoshima et al. | |
| 2003/0207983 A1 | 11/2003 | Sone et al. | |
| 2015/0307758 A1 | 10/2015 | Tazaki et al. | |

FOREIGN PATENT DOCUMENTS

| | | |
|---|---|---|
| CN | 101099097 A | 1/2008 |
| JP | H11142645 A | 5/1999 |
| JP | 2000334890 A | 12/2000 |
| JP | 2002194067 A | 7/2002 |
| JP | 2004156048 A | 6/2004 |
| WO | 2014091941 A1 | 6/2014 |

OTHER PUBLICATIONS

Nov. 16, 2018, Office Action issued by the State Intellectual Property Office in the corresponding Chinese Patent Application No. 201680016397.0.
Jun. 28, 2016, International Search Report issued in the International Patent Application No. PCT/JP2016/059034.
Sep. 26, 2017, International Preliminary Report on Patentability issued in the International Patent Application No. PCT/JP2016/059034.

* cited by examiner

*Primary Examiner* — Sheeba Ahmed
(74) *Attorney, Agent, or Firm* — Kenja IP Law PC

(57) ABSTRACT

An optical film including, in this order: a first layer containing a hydrogenated product of an aromatic vinyl compound-conjugated diene compound block copolymer; a second layer containing a norbornene-based polymer; and a third layer containing a hydrogenated product of an aromatic vinyl compound-conjugated diene compound block copolymer. Preferably, the hydrogenated product of the aromatic vinyl compound-conjugated diene compound block copolymer is a hydrogenated product of a styrene-isoprene copolymer. Preferably, a copolymerization ratio of styrene/isoprene in the hydrogenated product of the styrene-isoprene copolymer is 50/50 to 90/10.

6 Claims, No Drawings

OPTICAL FILM

FIELD

The present invention relates to an optical film.

BACKGROUND

As an optical film such as a phase difference film, a film for protecting a polarizing plate, and an optical compensation film, a film formed of a resin is generally used. One example of such an optical film formed of a resin is a film containing a norbornene-based polymer (see Patent Literatures 1 and 2).

CITATION LIST

Patent Literature

Patent Literature 1: Japanese Patent Application Laid-Open No. 11-142645 A
Patent Literature 2: Japanese Patent Application Laid-Open No. 2004-156048 A

SUMMARY

Technical Problem

In some cases depending on applications, the optical film may be bent during use. Therefore, the optical film is required to have excellent bending resistance. Although the prior-art films containing a norbornene-based polymer have excellent characteristics such as modulus of elongation and transparency, those films tend to have poor bending resistance.

The present invention has been created in view of the aforementioned problems. An object of the present invention is to provide an optical film which contains a norbornene-based polymer and has excellent bending resistance.

Solution to Problem

The present inventor has intensively studied to solve the aforementioned problems. As a result, the inventor has found that an optical film which has a first layer containing a hydrogenated product of an aromatic vinyl compound-conjugated diene compound block copolymer, a second layer containing a norbornene-based polymer, and a third layer containing a hydrogenated product of an aromatic vinyl compound-conjugated diene compound block copolymer in this order has excellent bending resistance. The present invention has thus been completed.

Specifically, the present invention is as follows.
(1) An optical film comprising, in this order:
a first layer containing a hydrogenated product of an aromatic vinyl compound-conjugated diene compound block copolymer;
a second layer containing a norbornene-based polymer; and
a third layer containing a hydrogenated product of an aromatic vinyl compound-conjugated diene compound block copolymer.
(2) The optical film according to (1), wherein the hydrogenated product of the aromatic vinyl compound-conjugated diene compound block copolymer is a hydrogenated product of a styrene-isoprene copolymer.
(3) The optical film according to (2), wherein a copolymerization ratio of styrene/isoprene in the hydrogenated product of the styrene-isoprene copolymer is 50/50 to 90/10.
(4) The optical film according to any one of (1) to (3), wherein a water absorption ratio measured in accordance with ASTM D570 is 0.1% by weight or less.

Advantageous Effects of Invention

The present invention can provide an optical film which contains a norbornene-based polymer and has excellent bending resistance.

DESCRIPTION OF EMBODIMENTS

Hereinafter, the present invention will be described in detail with reference to embodiments and examples. However, the present invention is not limited to the following embodiments and examples, which may be freely modified and implemented without departing from the scope of claims of the present invention and the scope of their equivalents.

In the following description, the "polarizing plate" is used as a term which encompasses not only a rigid member but also a flexible film such as a resin film, unless otherwise stated.

[1. Outline of Optical Film]

The optical film of the present invention is a film of a multi-layer structure comprising a first layer, a second layer, and a third layer in this order.

[2. First Layer]

The first layer contains a hydrogenated product of an aromatic vinyl compound-conjugated diene compound block copolymer. Therefore, the first layer is usually a resin layer formed of a resin containing the hydrogenated product of the aromatic vinyl compound-conjugated diene compound block copolymer. Hereinafter, the aforementioned resin containing the hydrogenated product of the aromatic vinyl compound-conjugated diene compound block copolymer is appropriately referred to as "hydrogenated polymer resin". The hydrogenated polymer resin is usually a thermoplastic resin.

The aromatic vinyl compound-conjugated diene compound block copolymer is a block copolymer obtained by block copolymerization of an aromatic vinyl compound, a conjugated diene compound, and if necessary, an optional monomer. The aforementioned block copolymer may be modified, for example, with alkoxysilane, carboxylic acid, carboxylic acid anhydride, or the like.

Examples of the aromatic vinyl compound may include styrene, α-methylstyrene, 2-methylstyrene, 3-methylstyrene, 4-methylstyrene, 2,4-diisopropylstyrene, 2,4-dimethylstyrene, 4-t-butylstyrene, 5-t-butyl-2-methylstyrene, 4-monochlorostyrene, dichlorostyrene, 4-monofluorostyrene, and 4-phenylstyrene. One type thereof may be solely used, and two or more types thereof may also be used in combination at any ratio. Among these, an aromatic vinyl compound having no polar group is preferable in terms of hygroscopicity. Styrene is particularly preferable in terms of industrial availability and shock resistance.

It is preferable that the conjugated diene compound is a linear conjugated diene compound. Examples of the linear conjugated diene compound may include 1,3-butadiene, isoprene, 2,3-dimethyl-1,3-butadiene, and 1,3-pentadiene. One type thereof may be solely used, and two or more types thereof may also be used in combination at any ratio. Among these, a linear conjugated diene compound having no polar group is preferable in terms of hygroscopicity. 1,3-butadiene and isoprene are more preferable, and isoprene is particularly preferable.

The copolymerization ratio of the aromatic vinyl compound/the conjugated diene compound is preferably 50/50 or more, more preferably 55/45 or more, and particularly preferably 60/40 or more, and is preferably 90/10 or less, more preferably 85/15 or less, and particularly preferably 80/20 or less. For example, in a styrene-isoprene block copolymer in which styrene is used as the aromatic vinyl compound and isoprene is used as the conjugated diene compound, it is preferable that the copolymerization ratio of styrene/isoprene falls within the aforementioned range. When the aforementioned copolymerization ratio is equal to or more than the lower limit value of the aforementioned range, fusion of the surface of the optical film and blocking can be suppressed. When the copolymerization ratio is equal to or less than the upper limit value, the bending resistance of the optical film can be further improved.

Since the aforementioned block copolymer is a block copolymer of the aromatic vinyl compound and the conjugated diene block copolymer, the block copolymer usually contains a polymer block [A] containing an aromatic vinyl compound unit and a polymer block [B] containing a conjugated diene compound unit. The aromatic vinyl compound unit herein refers to a structural unit having a structure formed by polymerization of the aromatic vinyl compound. The conjugated diene compound unit refers to a structural unit having a structure formed by polymerization of the conjugated diene compound.

It is preferable that the polymer block [A] contains the aromatic vinyl compound unit as a main component. Specifically, the ratio of the aromatic vinyl compound unit in the polymer block [A] is preferably 90% by weight to 100% by weight, more preferably 95% by weight to 100% by weight, and particularly preferably 99% by weight to 100% by weight. When the amount of the aromatic vinyl compound unit in the polymer block [A] is large as described above, the heat resistance of the hydrogenated polymer resin can be enhanced.

The polymer block [A] may contain an optional structural unit, in addition to the aromatic vinyl compound unit. Examples of the optional structural unit may include a conjugated diene compound unit, and a structural unit having a structure formed by polymerization of a vinyl compound other than the aromatic vinyl compound.

Examples of the vinyl compound other than the aromatic vinyl compound may include a linear vinyl compound; a cyclic vinyl compound; a vinyl compound having a nitrile group, an alkoxycarbonyl group, a hydroxycarbonyl group, or a halogen group; an unsaturated cyclic acid anhydride; and an unsaturated imide compound. Among these, a vinyl compound having no polar group, including a linear olefin such as ethylene, propylene, 1-butene, 1-pentene, 1-hexene, 1-heptene, 1-octene, 1-nonene, 1-decene, 1-dodecene, 1-eicosene, 4-methyl-1-pentene, and 4,6-dimethyl-1-heptene; and a cyclic olefin such as vinylcyclohexane is preferable in terms of hygroscopicity. Among these, a linear olefin is more preferable, and ethylene and propylene are particularly preferable. One type thereof may be solely used, and two or more types thereof may also be used in combination at any ratio.

The content ratio of the optional structural unit in the polymer block [A] is preferably 10% by weight or less, more preferably 5% by weight or less, and particularly preferably 1% by weight or less.

The number of the polymer block [A] in one molecule of the block copolymer is preferably 2 or more, and is preferably 5 or less, more preferably 4 or less, and particularly preferably 3 or less. A plurality of polymer blocks [A] in one molecule may be the same or different from each other.

When a plurality of different polymer blocks [A] are contained in one molecule of the block copolymer, let Mw(A1) denote the weight-average molecular weight of a polymer block having the largest weight-average molecular weight in the polymer block [A], and Mw(A2) denote the weight-average molecular weight of a polymer block having the smallest weight-average molecular weight. In this case, the ratio of Mw(A1) relative to Mw(A2) "Mw(A1)/Mw(A2)" is preferably 2.0 or less, more preferably 1.5 or less, and particularly preferably 1.2 or less. Thereby dispersion of various values of properties can be suppressed at a low degree.

It is preferable that the polymer block [B] contains the conjugated diene compound unit as a main component. Specifically, the ratio of the conjugated diene compound unit in the polymer block [B] is preferably 90% by weight to 100% by weight, more preferably 95% by weight to 100% by weight, and particularly preferably 99% by weight to 100% by weight. When the amount of the conjugated diene compound unit in the polymer block [B] is large as described above, the bending resistance of the optical film at a low temperature can be effectively improved.

The polymer block [B] may contain an optional structural unit, in addition to the conjugated diene compound unit. Examples of the optional structural unit may include an aromatic vinyl compound unit, and a structural unit having a structure formed by polymerization of a vinyl compound other than the aromatic vinyl compound.

The content ratio of the optional structural unit in the polymer block [B] is preferably 10% by weight or less, more preferably 5% by weight or less, and particularly preferably 1% by weight or less. In particular, when the content ratio of the aromatic vinyl compound unit in the polymer block [B] is low, the flexibility of the hydrogenated polymer resin at a low temperature can be improved, and the bending resistance of the optical film at a low temperature can be effectively improved.

The number of the polymer block [B] in one molecule of the block copolymer is usually one or more, and may also be two or more. When the number of the polymer block [B] in the block copolymer is two or more, the polymer blocks [B] may be the same or different from each other.

When a plurality of different polymer blocks [B] are contained in one molecule of the block copolymer, let Mw(B1) denote the weight-average molecular weight of a polymer block having the largest weight-average molecular weight in the polymer block [B], and Mw(B2) denote the weight-average molecular weight of a polymer block having the smallest weight-average molecular weight. In this case, the ratio of Mw(B1) relative to Mw(B2) "Mw(B1)/Mw(B2)" is preferably 2.0 or less, more preferably 1.5 or less, and particularly preferably 1.2 or less. Thereby dispersion of various values of properties can be suppressed at a low degree.

In the block copolymer, the ratio of the weight fraction wA of the total polymer block [A] in the total block copolymer relative to the weight fraction wB of the total polymer block [B] in the total block copolymer (wA/wB) is preferably 50/50 or more, more preferably 55/45 or more, and is preferably 90/10 or less, and more preferably 85/15 or less. When the ratio wA/wB is equal to or more than the lower limit value of the aforementioned range, the heat resistance of the hydrogenated polymer resin can be improved. When the ratio wA/wB is equal to or less than the upper limit value, the flexibility of the hydrogenated polymer resin can be enhanced. Further, the glass transition temperature of the block copolymer can be decreased.

The form of block of the block copolymer may be a linear block or a radial block. Among these, a linear block is preferable since it has excellent mechanical strength.

When the block copolymer has a form of linear block, it is preferable that the polymer block [A] is present at both ends of the block copolymer. With this configuration, the tackiness of the hydrogenated polymer resin can be reduced.

The form of block of the block copolymer is particularly preferably a triblock copolymer having an [A]-[B]-[A] structure in which the polymer blocks [A] are bonded to both ends of the polymer block [B]; or a pentablock copolymer having an [A]-[B]-[A]-[B]-[A] structure in which the polymer blocks [B] are bonded to both ends of the polymer block [A] and further polymer blocks [A] are bonded to another end of each of the polymer blocks [B]. It is particularly preferable that the block copolymer is a triblock copolymer because therewith production can be facilitated and properties such as viscosity can be adjusted within desired ranges.

The molecular weight of the aforementioned block copolymer as a weight-average molecular weight (Mw) in terms of polystyrene which is measured by GPC using tetrahydrofuran (THF) as a solvent is preferably 30,000 or more, more preferably 40,000 or more, and particularly preferably 50,000 or more, and is preferably 200,000 or less, more preferably 150,000 or less, and particularly preferably 100,000 or less.

The molecular weight distribution (Mw/Mn) of the block copolymer is preferably 3 or less, more preferably 2 or less, and particularly preferably 1.5 or less.

The method for producing the aforementioned aromatic vinyl compound-conjugated diene compound block copolymer is not limited. When a block copolymer having three polymer blocks is produced, examples of the method may include the following production methods 1 and 2. Herein, a material referred to as "monomer composition" includes not only a mixture of two or more types of materials but also a material composed of a single material.

(Production Method 1) A method including:

a first step of polymerizing a monomer composition (a1) containing the aromatic vinyl compound to form the polymer block [A];

a second step of polymerizing a monomer composition (b1) containing the conjugated diene compound to form the polymer block [B] at an end of the polymer block [A], resulting in a diblock polymer of [A]-[B]; and a third step of polymerizing a monomer composition (a2) containing the aromatic vinyl compound at an end of the diblock polymer on a side of the block [B] to obtain the block copolymer. Herein, the monomer composition (a1) and the monomer composition (a2) may be the same or different.

(Production Method 2) A method including:

a first step of polymerizing a monomer composition (a1) containing the aromatic vinyl compound to form the polymer block [A];

a second step of polymerizing a monomer composition (b1) containing the conjugated diene compound to form the polymer block [B] at an end of the polymer block [A], resulting in a diblock polymer of [A]-[B]; and a third step of coupling an end of the diblock polymer on a side of the polymer block [B] to an end of another diblock polymer on the side of the polymer block [B] using a coupling agent, to obtain the block copolymer.

As a method for polymerizing monomer composition to obtain the polymer block, for example, radical polymerization, anionic polymerization, cationic polymerization, coordination anionic polymerization, coordination cationic polymerization, or the like may be used. For facilitating the polymerization operation and a hydrogenation reaction in a subsequent step, preferably the method is a method of performing radical polymerization, anionic polymerization, or cationic polymerization by living polymerization, and particularly preferably by living anionic polymerization.

The aforementioned polymerization of the monomer compositions may be performed in the presence of a polymerization initiator in a temperature range of preferably 0° C. or higher, more preferably 10° C. or higher, and particularly preferably 20° C. or higher, and of preferably 100° C. or lower, more preferably 80° C. or lower, and particularly preferably 70° C. or lower.

In living anionic polymerization, for example, monoorganic lithium such as n-butyl lithium, sec-butyl lithium, t-butyl lithium, or hexyl lithium; a multifunctional organic lithium compound such as dilithiomethane, 1,4-dilithiobutane, or 1,4-dilithio-2-ethylcyclohexane; or the like may be used as the polymerization initiator. One type thereof may be solely used, and two or more types thereof may also be used in combination at any ratio.

Examples of mode of polymerization reaction may include solution polymerization and slurry polymerization. In particular, use of solution polymerization facilitates removal of reaction heat.

When solution polymerization is performed, an inert solvent capable of dissolving the polymer obtained in each step may be used as a solvent. Examples of the inert solvent may include an aliphatic hydrocarbon solvent, such as n-pentane, isopentane, n-hexane, n-heptane, and isooctane; an alicyclic hydrocarbon solvent, such as cyclopentane, cyclohexane, methylcyclopentane, methylcyclohexane, and decalin; and an aromatic hydrocarbon solvent, such as benzene and toluene. One type thereof may be solely used, and two or more types thereof may also be used in combination at any ratio. In particular, it is preferable to use an alicyclic hydrocarbon solvent as the solvent because it can be directly used in a hydrogenation reaction as the inert solvent and the solubility of the block copolymer is favorable. The amount of the solvent to be used is preferably 200 parts by weight to 2,000 parts by weight relative to 100 parts by weight of all the monomers used.

When each monomer composition contains two or more types of monomers, for example, a randomizer may be used to prevent elongation of a chain of only one component. In particular, when a polymerization reaction is performed by anionic polymerization, for example, a Lewis base compound is preferably used as the randomizer. Examples of the Lewis base compound may include an ether compound, such as dimethyl ether, diethyl ether, diisopropyl ether, dibutyl ether, tetrahydrofuran, diphenyl ether, ethylene glycol diethyl ether, and ethylene glycol methyl phenyl ether; a tertiary amine compound, such as tetramethyl ethylene diamine, trimethylamine, triethylamine, and pyridine; an alkali metal alkoxide compound, such as potassium t-amyloxide, and potassium t-butyloxide; and a phosphine compound, such as triphenyl phosphine. One type thereof may be solely used, and two or more types thereof may also be used in combination at any ratio.

The hydrogenated product of the aromatic vinyl compound-conjugated diene compound block copolymer is a polymer obtained through a step of hydrogenating the aromatic vinyl compound-conjugated diene compound block copolymer described above. If necessary, the hydrogenated product may be modified, for example, with alkoxysilane, carboxylic acid, carboxylic acid anhydride, or the like. Use of the hydrogenated product can decrease the amount of outgas generation from the hydrogenated polymer resin.

The aforementioned hydrogenated product is a product obtained by hydrogenating an unsaturated bond of the aromatic vinyl compound-conjugated diene compound block copolymer described above. The unsaturated bond of the block copolymer includes aromatic and non-aromatic unsaturated carbon-carbon bonds in main and side chains of the block copolymer. The hydrogenation ratio is preferably 90% or more, more preferably 97% or more, and particularly preferably 99% or more of the total unsaturated bond of the block copolymer. With a high hydrogenation ratio, the heat resistance and light resistance of the hydrogenated polymer resin can be improved. The hydrogenation ratio of the hydrogenated product may be determined by measurement through $^1$H-NMR.

Particularly, the hydrogenation ratio of the non-aromatic unsaturated bond is preferably 95% or more, and more preferably 99% or more. When the hydrogenation ratio of the non-aromatic unsaturated carbon-carbon bond is increased, the light resistance and oxidation resistance of the hydrogenated polymer resin can be further enhanced.

The hydrogenation ratio of the aromatic unsaturated carbon-carbon bond is preferably 90% or more, more preferably 93% or more, and particularly preferably 95% or more. When the hydrogenation ratio of the unsaturated carbon-carbon bond in an aromatic ring is increased, the glass transition temperature of a polymer block obtained by hydrogenation of the polymer block [A] increases. Consequently, the heat resistance of the hydrogenated polymer resin can be effectively enhanced.

The weight-average molecular weight (Mw) of the hydrogenated product of the block copolymer in terms of polystyrene that is measured by gel permeation chromatography (GPC) using tetrahydrofuran as a solvent is preferably 30,000 or more, more preferably 40,000 or more, and particularly preferably 45,000 or more, and is preferably 200,000 or less, more preferably 150,000 or less, and particularly preferably 100,000 or less. The molecular weight distribution (Mw/Mn) of the hydrogenated product of the block copolymer is preferably 3 or less, more preferably 2 or less, and particularly preferably 1.5 or less. When the weight-average molecular weight Mw and molecular weight distribution Mw/Mn of the hydrogenated product of the block copolymer fall within the aforementioned ranges, the mechanical strength and heat resistance of the hydrogenated polymer resin can be improved.

In the hydrogenated product of the block copolymer, the ratio of the weight fraction wA of the total polymer block [A] in the total block copolymer relative to the weight fraction wB of the total polymer block [B] in the total block copolymer (wA/wB) is usually the same as the ratio wA/wB in the block copolymer before hydrogenation.

It is preferable that the hydrogenated product of the block copolymer has an alkoxysilyl group in a molecular structure thereof. The hydrogenated product of the block copolymer that has an alkoxysilyl group may be obtained, for example, by bonding an alkoxysilyl group to the hydrogenated product of the block copolymer that does not have an alkoxysilyl group. In this case, the alkoxysilyl group may be directly bonded to the hydrogenated product of the block copolymer or bonded through a divalent organic group such as an alkylene group.

The hydrogenated product of the block copolymer that has an alkoxysilyl group has particularly excellent adhesion to a material such as glass, an inorganic material, and a metal. Therefore, when the optical film is bonded to an optional member, the adhesion of the optical film to the optional member can be particularly enhanced.

The amount of the alkoxysilyl group to be introduced is preferably 0.1 parts by weight or more, more preferably 0.2 parts by weight or more, and particularly preferably 0.3 parts by weight or more, and is preferably 10 parts by weight or less, more preferably 5 parts by weight or less, and particularly preferably 3 parts by weight or less, relative to 100 parts by weight of the hydrogenated product of the block copolymer before the introduction of the alkoxysilyl group. When the amount of the alkoxysilyl group introduced falls within the aforementioned range, the degree of cross-linking of alkoxysilyl groups decomposed by moisture or the like can be prevented from being excessively increased. Therefore, the adhesion can be highly maintained.

The amount of the alkoxysilyl group introduced may be determined from $^1$H-NMR spectrum (when the introduced amount is small, the number of integration times is increased).

Since the amount of the alkoxysilyl group introduced is small, the molecular weight of the hydrogenated product of the block copolymer that has an alkoxysilyl group is not largely changed as compared with the molecular weight of the hydrogenated product of the block copolymer before the introduction of the alkoxysilyl group. However, when the hydrogenated product of the block copolymer is subjected to a modification reaction in the presence of a peroxide during introduction of the alkoxysilyl group, a crosslinking reaction and a scission reaction of the hydrogenated product may be promoted, and as a result, the molecular weight distribution may be largely changed. The weight-average molecular weight of the hydrogenated product of the block copolymer that has an alkoxysilyl group as a value in terms of polystyrene that is measured by gel permeation chromatography (GPC) using tetrahydrofuran as a solvent is preferably 30,000 or more, more preferably 40,000 or more, and particularly preferably 50,000 or more, and is preferably 200,000 or less, more preferably 150,000 or less, and particularly preferably 120,000 or less. The molecular weight distribution (Mw/Mn) of the hydrogenated product of the block copolymer that has an alkoxysilyl group is preferably 3.5 or less, more preferably 2.5 or less, and particularly preferably 2.0 or less. When the weight-average molecular weight Mw and molecular weight distribution Mw/Mn of the hydrogenated product of the block copolymer that has an alkoxysilyl group fall within the aforementioned ranges, the mechanical strength and tensile elongation of the hydrogenated polymer resin can be improved.

The method for producing the hydrogenated product of the block copolymer as described above usually includes hydrogenation of the aforementioned block copolymer. It is preferable that the hydrogenation method is a hydrogenation method capable of increasing the hydrogenation ratio with reduced chain scission reaction of the block copolymer. Examples of such a preferable hydrogenation method may include a method in which hydrogenation is performed using a hydrogenation catalyst containing at least one type of metal selected from the group consisting of nickel, cobalt, iron, titanium, rhodium, palladium, platinum, ruthenium, and rhenium. As the hydrogenation catalyst, one type thereof may be solely used, and two or more types thereof may also be used in combination at any ratio. As the hydrogenation catalyst, any of a heterogeneous catalyst and a homogeneous catalyst may be used. It is preferable that the hydrogenation reaction is performed in an organic solvent.

The heterogeneous catalyst may be used, for example, in a state of a free metal or a metal compound. The heterogeneous catalyst may be supported on an appropriate carrier for use. Examples of the carrier may include activated carbon, silica, alumina, calcium carbonate, titania, magnesia, zirconia, diatomaceous earth, silicon carbide, and calcium fluoride. The amount of the catalyst to be supported is preferably 0.1% by weight or more, and more preferably 1% by weight or more, and is preferably 60% by weight or less, and more preferably 50% by weight or less relative to the total amount of the catalyst and the carrier. The specific surface area of a supported type catalyst is preferably 100 $m^2/g$ to 500 $m^2/g$. The average micropore diameter of the supported type catalyst is preferably 100 Å or more, and more preferably 200 Å or more, and is preferably 1,000 Å or less, and more preferably 500 Å or less. Herein, the specific surface area may be determined by measuring the nitrogen adsorption amount and using a BET equation. The average micropore diameter may be measured through a mercury penetration method.

As the homogeneous catalyst, for example, a catalyst including a compound of nickel, cobalt, titanium, or iron in combination with an organometallic compound; an organometallic complex catalyst of, for example, rhodium, palladium, platinum, ruthenium, or rhenium; or the like may be used.

Examples of the compound of nickel, cobalt, titanium, or iron may include acetylacetonate compounds, carboxylic acid salts, and cyclopentadienyl compounds of each of the metals.

Examples of the organometallic compound may include organoaluminum compounds including alkyl aluminum such as triethyl aluminum and triisobutyl aluminum, halogenated aluminum such as diethyl aluminum chloride and ethyl aluminum dichloride, and hydrogenated alkyl aluminum such as diisobutyl aluminum hydride; and organolithium compounds.

Examples of the organometallic complex catalyst may include transition metal complexes such as dihydride-tetrakis(triphenylphosphine)ruthenium, dihydride-tetrakis(triphenylphosphine)iron, bis(cyclooctadiene)nickel, and bis(cyclopentadienyl)nickel.

The amount of the hydrogenation catalyst is preferably 0.01 parts by weight or more, more preferably 0.05 parts by weight or more, and particularly preferably 0.1 parts by weight or more, and is preferably 100 parts by weight or less, more preferably 50 parts by weight or less, and particularly preferably 30 parts by weight or less, relative to 100 parts by weight of the block copolymer.

The temperature of the hydrogenation reaction is preferably 10° C. or higher, more preferably 50° C. or higher, and particularly preferably 80° C. or higher, and is preferably 250° C. or lower, more preferably 200° C. or lower, and particularly preferably 180° C. or lower. When the hydrogenation reaction is performed in such a temperature range, the hydrogenation ratio can be increased, and the molecular scission of the block copolymer can be decreased.

The hydrogen pressure during the hydrogenation reaction is preferably 0.1 MPa or more, more preferably 1 MPa or more, and particularly preferably 2 MPa or more, and is preferably 30 MPa or less, more preferably 20 MPa or less, and particularly preferably 10 MPa or less. When the hydrogenation reaction is performed at such a hydrogen pressure, the hydrogenation ratio can be increased, and the molecular chain scission of the block copolymer can be decreased. Therefore, the operation can be made favorable.

When the block copolymer is hydrogenated as described above, the hydrogenated product of the block copolymer is obtained as a product. The product after the hydrogenation reaction may be used as it is. If necessary, the product after the hydrogenation reaction may be subjected to any treatment before use. For example, the product after the hydrogenation reaction may be subjected to a treatment of introducing an alkoxysilyl group, if necessary.

As the method for introducing an alkoxysilyl group into the hydrogenated product of the block copolymer, for example, a method in which the hydrogenated product of the block copolymer before the introduction of the alkoxysilyl group is reacted with an ethylenically unsaturated silane compound in the presence of a peroxide may be used.

As the ethylenically unsaturated silane compound, an ethylenically unsaturated silane compound that is capable of causing graft polymerization with the hydrogenated product of the block copolymer for introducing an alkoxysilyl group into the hydrogenated product of the block copolymer may be used. Examples of the ethylenically unsaturated silane compound may include vinyltrimethoxysilane, vinyltriethoxysilane, allyltrimethoxysilane, allyltriethoxysilane, dimethoxymethylvinylsilane, diethoxymethylvinylsilane, p-styryltrimethoxysilane, p-styryltriethoxysilane, 3-methacryloxypropyltrimethoxysilane, 3-methacryloxypropylmethyldimethoxysilane, 3-methacryloxypropyltriethoxysilane, 3-methacryloxypropylmethyldiethoxysilane, 3-acryloxypropyltrimethoxysilane, 3-acryloxypropyltriethoxysilane, and 2-norbornen-5-yltrimethoxysilane. Among these, vinyltrimethoxysilane, vinyltriethoxysilane, allyltrimethoxysilane, allyltriethoxysilane, dimethoxymethylvinylsilane, diethoxymethylvinylsilane, and p-styryltrimethoxysilane are preferable. As the ethylenically unsaturated silane compound, one type thereof may be solely used, and two or more types thereof may also be used in combination at any ratio.

The amount of the ethylenically unsaturated silane compound is preferably 0.1 parts by weight or more, more preferably 0.2 parts by weight or more, and particularly preferably 0.3 parts by weight or more, and is preferably 10 parts by weight or less, more preferably 5 parts by weight or less, and particularly preferably 3 parts by weight or less, relative to 100 parts by weight of the hydrogenated product of the block copolymer before the introduction of the alkoxysilyl group.

Examples of the peroxide may include organic peroxides, such as dibenzoyl peroxide, t-butyl peroxyacetate, 2,2-di(t-butylperoxy)butane, t-butyl peroxybenzoate, t-butyl cumyl peroxide, dicumyl peroxide, di-t-hexyl peroxide, 2,5-dimethyl-2,5-di(t-butylperoxyhexane), di-t-butyl peroxide, 2,5-dimethyl-2,5-di(t-butylperoxy)hexane-3, t-butyl hydroperoxide, t-butyl peroxyisobutyrate, lauroyl peroxide, dipropionyl peroxide, and p-menthane hydroperoxide. Among these, a peroxide having a 1-minute half-life temperature of 170 to 190° C. is preferable. For example, t-butyl cumyl peroxide, dicumyl peroxide, di-t-hexyl peroxide, 2,5-dimethyl-2,5-di(t-butylperoxyhexane), and di-t-butyl peroxide are preferable. As the peroxide, one type thereof may be solely used, and two or more types thereof may also be used in combination at any ratio.

The amount of the peroxide is preferably 0.01 parts by weight or more, more preferably 0.2 parts by weight or more, and particularly preferably 0.3 parts by weight or more, and is preferably 5 parts by weight or less, more preferably 3 parts by weight or less, and particularly preferably 2 parts by weight or less, relative to 100 parts by weight of the hydrogenated product of the block copolymer before the introduction of the alkoxysilyl group.

The method for reacting the hydrogenated product of the block copolymer with the ethylenically unsaturated silane compound in the presence of the peroxide may be performed using a heating kneader or a reaction vessel. For example, a mixture of the hydrogenated product of the block copolymer, the ethylenically unsaturated silane compound, and the peroxide is melted with heating using a biaxial kneader at a temperature that is equal to or higher than the melting temperature of the hydrogenated product of the block copolymer and kneaded for a desired time. By this procedure, the alkoxysilyl group can be introduced into the hydrogenated product of the block copolymer. Specifically, the temperature is preferably 180° C. or higher, more preferably 190° C. or higher, and particularly preferably 200° C. or higher, and is preferably 240° C. or lower, more preferably 230° C. or lower, and particularly preferably 220° C. or lower. The heating and kneading time is preferably 0.1 minutes or more, more preferably 0.2 minutes or more, and particularly preferably 0.3 minutes or more, and is preferably 15 minutes or less, more preferably 10 minutes or less, and particularly preferably 5 minutes or less. When a continuous kneading system including a biaxial kneader and an uniaxial extruder is used, the mixture may be continuously kneaded and extruded so that the retention time falls within the aforementioned range.

The hydrogenated product of the block copolymer obtained by the aforementioned method is usually obtained as a reaction liquid containing the hydrogenated product of the block copolymer, the hydrogenation catalyst, and a polymerization catalyst. The hydrogenated product of the block copolymer may be collected from this reaction liquid, for example, after the hydrogenation catalyst and the polymerization catalyst are removed from the reaction liquid by a method such as filtration and centrifugation. Examples of the method for collecting the hydrogenated product of the block copolymer from the reaction liquid may include a steam solidification method of removing a solvent by steam stripping from a solution in which the hydrogenated product of the block copolymer is dissolved; a direct desolvating method of removing a solvent by heating under reduced pressure; and a solidification method in which a solution is poured into a poor solvent of the hydrogenated product of the block copolymer, resulting in precipitation and solidification of the hydrogenated product of the block copolymer.

The hydrogenated polymer resin may contain an optional component in combination with the hydrogenated product of the block copolymer described above. Examples of the optional component may include a plasticizer for adjusting the glass transition temperature and the modulus of elasticity, a photostabilizer for improving the weather resistance and heat resistance, an ultraviolet ray absorber, an antioxidant, a lubricant, and an inorganic filler. As the optional component, one type thereof may be solely used, and two or more types thereof may also be used in combination at any ratio.

Examples of the plasticizer may include polyisobutene, hydrogenated polyisobutene, hydrogenated polyisoprene, a hydrogenated 1,3-pentadiene-based petroleum resin, a hydrogenated cyclopentadiene-based petroleum resin, and a hydrogenated styrene-indene-based petroleum resin.

The amount of the plasticizer is preferably 40 parts by weight or less relative to 100 parts by weight of the hydrogenated polymer resin, and is appropriately selected for adjustment of characteristics of the resin.

It is preferable that the photostabilizer is a hindered amine-based photostabilizer, and particularly preferably a compound having a 3,5-di-t-butyl-4-hydroxyphenyl group, a 2,2,6,6-tetramethylpiperidyl group, or a 1,2,2,6,6-pentamethyl-4-piperidyl group in the structure. Specific examples of the photostabilizer may include photostabilizers described in International publication No. 2014/091941.

The amount of the photostabilizer is preferably 0.01 parts by weight or more, more preferably 0.02 parts by weight or more, and particularly preferably 0.03 parts by weight or more, and is preferably 5 parts by weight or less, more preferably 2 parts by weight or less, and particularly preferably 1 part by weight or less, relative to 100 parts by weight of the hydrogenated product of the block copolymer. When the amount of the photostabilizer is equal to or more than the lower limit value of the aforementioned range, the weather resistance of the hydrogenated polymer resin can be enhanced. When it is equal to or less than the upper limit value, contamination of a T-die and a cooling roller in an extruder can be prevented during molding of the hydrogenated polymer resin, and the processability can be enhanced.

Examples of the ultraviolet ray absorber may include a benzophenone-based ultraviolet ray absorber, a salicylic acid-based ultraviolet ray absorber, and a benzotriazole-based ultraviolet ray absorber. Specific examples of the ultraviolet ray absorber may include ultraviolet ray absorbers described in International publication No. 2014/091941.

The amount of the ultraviolet ray absorber is preferably 0.01 parts by weight or more, more preferably 0.02 parts by weight or more, and particularly preferably 0.04 parts by weight or more, and is preferably 1 part by weight or less, more preferably 0.5 parts by weight or less, and particularly preferably 0.3 parts by weight or less, relative to 100 parts by weight of the hydrogenated product of the block copolymer. When the ultraviolet ray absorber is used in an amount equal to or more than the lower limit value of the aforementioned range, the light resistance of the hydrogenated polymer resin can be improved. When the ultraviolet ray absorber is used in an excessive amount more than the upper limit, further improvement is hardly achieved.

Examples of the antioxidant may include a phosphorous-based antioxidant, a phenol-based antioxidant, and a sulfur-based antioxidant. A phosphorous-based antioxidant that reduces coloring is preferable. Specific examples of the antioxidant may include antioxidants described in International publication No. 2014/091941.

The amount of the antioxidant is preferably 0.01 parts by weight or more, more preferably 0.05 parts by weight or more, and particularly preferably 0.1 parts by weight or more, and is preferably 1 part by weight or less, more preferably 0.5 parts by weight or less, and particularly preferably 0.3 parts by weight or less, relative to 100 parts by weight of the hydrogenated product of the block copolymer. When the antioxidant is used in an amount equal to or more than the lower limit value of the aforementioned range, the thermal stability of the hydrogenated polymer resin can be improved. When the antioxidant is used in an excessive amount more than the upper limit, further improvement is hardly achieved.

The glass transition temperature of the hydrogenated polymer resin is preferably 30° C. or higher, more preferably 50° C. or higher, and particularly preferably 70° C. or higher, and is preferably 200° C. or lower, more preferably 180° C. or lower, and particularly preferably 160° C. or lower. The hydrogenated polymer resin may have a plurality of glass transition temperatures. In this case, it is preferable that the highest glass transition temperature of the resin falls within the aforementioned range.

The hydrogenated product of the block copolymer is usually an elastomer. Therefore, the hydrogenated polymer resin containing the hydrogenated product of the block copolymer has excellent flexibility. As the optical film of the present invention has a layer of the hydrogenated polymer resin (i.e., the first and third layers) having such flexibility on both sides of the second layer containing a norbornene-based polymer, the bending resistance can be improved without largely deteriorating excellent characteristics of the norbornene-based polymer.

The thickness of the first layer is preferably 2 μm or more, and more preferably 5 μm or more, and is preferably 50 μm or less, and more preferably 30 μm or less. When the thickness of the first layer is equal to or more than the lower limit value of the aforementioned range, the bending resistance can be further improved. When the thickness is equal to or less than the upper limit value of the aforementioned range, the thickness of the entire optical film can be decreased.

The ratio of the thickness of the first layer relative to that of the second layer (first layer/second layer) is preferably 5/95 or more, and more preferably 10/90 or more, and is preferably 60/40 or less, and more preferably 40/60 or less. When the thickness ratio is equal to or more than the lower limit value of the aforementioned range, the bending resistance can be further improved. When the thickness ratio is equal to or less than the upper limit value of the aforementioned range, the modulus of elasticity and heat resistance of the entire optical film can be maintained.

[3. Second Layer]

The second layer contains a norbornene-based polymer. Therefore, the second layer is usually a resin layer formed of a resin containing the norbornene-based polymer. Hereinafter, the resin containing the norbornene-based polymer is appropriately referred to as "norbornene-based resin". This norbornene-based resin is usually a thermoplastic resin.

Examples of the norbornene-based polymer may include: a ring-opened polymer of a monomer having a norbornene structure and a hydrogenated product thereof; and an addition polymer of a monomer having a norbornene structure and a hydrogenated product thereof. Examples of the ring-opened polymer of a monomer having a norbornene structure may include a ring-opened homopolymer of one type of monomer having a norbornene structure, a ring-opened copolymer of two or more types of monomers each having a norbornene structure, and a ring-opened copolymer of a monomer having a norbornene structure and an optional monomer which is copolymerizable therewith. Furthermore, examples of the addition polymer of a monomer having a norbornene structure may include an addition homopolymer of one type of monomer having a norbornene structure, an addition copolymer of two or more types of monomers each having a norbornene structure, and an addition copolymer of a monomer having a norbornene structure and an optional monomer which is copolymerizable therewith. Among these, a hydrogenated product of a ring-opened polymer of a monomer having a norbornene structure is particularly suitable from the viewpoint of molding properties, heat resistance, low hygroscopicity, size stability, lightweight properties, and the like.

Examples of the monomer having a norbornene structure may include bicyclo[2.2.1]hept-2-ene (common name: norbornene), tricyclo[4.3.0.1$^{2,5}$]dec-3,7-diene (common name: dicyclopentadiene), 7,8-benzotricyclo[4.3.0.1$^{2,5}$]dec-3-ene (common name: methanotetrahydrofluorene), tetracyclo[4.4.0.1$^{2,5}$.1$^{7,10}$]dodeca-3-ene (common name: tetracyclododecene), and derivatives of these compounds (for example, a derivative having a substituent on the ring). Here, examples of the substituent may include an alkyl group, an alkylene group, and a polar group. A plurality of these substituents, which are the same as or different from each other, may be bonded on the ring. As the monomer having a norbornene structure, one type thereof may be solely used, and two or more types thereof may also be used in combination at any ratio.

Examples of the polar group may include a hetero atom, and an atomic group having a hetero atom. Examples of the hetero atom may include an oxygen atom, a nitrogen atom, a sulfur atom, a silicon atom, and a halogen atom. Specific examples of the polar group may include a carboxyl group, a carbonyloxycarbonyl group, an epoxy group, a hydroxyl group, an oxy group, an ester group, a silanol group, a silyl group, an amino group, a nitrile group, and a sulfonic acid group.

Examples of the monomer which is ring-opening copolymerizable with the monomer having a norbornene structure may include: monocyclic olefins such as cyclohexene, cycloheptene, cyclooctene, and derivatives thereof; and cyclic conjugated diene such as cyclohexadiene and cycloheptadiene, and a derivative thereof. As the monomer which is ring-opening copolymerizable with the monomer having a norbornene structure, one type thereof may be solely used, and two or more types thereof may also be used in combination at any ratio.

The ring-opened polymer of a monomer having a norbornene structure may be produced by, for example, the polymerization or copolymerization of a monomer in the presence of a ring-opening polymerization catalyst.

Examples of the monomer which is addition copolymerizable with the monomer having a norbornene structure may include: α-olefin having 2 to 20 carbon atoms, such as ethylene, propylene, and 1-butene, and derivatives thereof; cycloolefin, such as cyclobutene, cyclopentene and cyclohexene, and derivatives thereof; and non-conjugated diene, such as 1,4-hexadiene, 4-methyl-1,4-hexadiene, and 5-methyl-1,4-hexadiene. Among these, α-olefin is preferable, and ethylene is more preferable. As the monomer which is addition copolymerizable with the monomer having a norbornene structure, one type thereof may be solely used, and two or more types thereof may also be used in combination at any ratio.

The addition polymer of a monomer having a norbornene structure may be produced by, for example, the polymerization or copolymerization of a monomer in the presence of an addition polymerization catalyst.

The hydrogenated product of the ring-opened polymer or the addition polymer described above may be produced by, for example, hydrogenating preferably 90% or more of unsaturated carbon-carbon bonds in a solution of the ring-opened polymer or the addition polymer, in the presence of a hydrogenation catalyst which contains transition metal such as nickel and palladium.

Preferably, the norbornene-based polymer includes, as a structural unit, X: a bicyclo[3.3.0]octane-2,4-diyl-ethylene structure, and Y: a tricyclo[4.3.0.1$^{2,5}$]decane-7,9-diyl-ethylene structure, wherein the norbornene-based polymer contains these structural units in an amount of 90% by weight or more relative to the entire structural units of the norbornene-based polymer, and the ratio between the proportion of X and the proportion of Y is 100:0 to 40:60 in terms of the weight ratio of X:Y. Use of such a polymer enables the optical film to show no changes in size in a long period of time and to have excellent stability of optical characteristics.

The weight-average molecular weight (Mw) of the norbornene-based polymer is preferably 10,000 or more, more preferably 15,000 or more, and particularly preferably 20,000 or more, and is preferably 100,000 or less, more preferably 80,000 or less, and particularly preferably 50,000 or less. When the weight-average molecular weight falls within such a range, mechanical strength and molding processability of the second layer can be highly balanced.

The molecular weight distribution (weight-average molecular weight (Mw)/number-average molecular weight (Mn)) of the norbornene-based polymer is preferably 1.2 or more, more preferably 1.5 or more, and particularly preferably 1.8 or more, and is preferably 3.5 or less, more preferably 3.0 or less, and particularly preferably 2.7 or less. When the molecular weight distribution is equal to or more than the lower limit value of the aforementioned range, the productivity of the norbornene-based polymer can be enhanced, thereby reducing production costs. When the molecular weight distribution is equal to or less than the upper limit value, the amount of a low-molecular component is reduced. This can suppress relaxation during exposure to high temperature to enhance the stability of the optical film.

The weight-average molecular weight (Mw) and the number-average molecular weight (Mn) may be measured as a weight-average molecular weight in terms of polyisoprene or polystyrene by gel permeation chromatography with cyclohexane as a solvent (however, when the sample is not dissolved in cyclohexane, toluene may be used).

The saturated water absorption ratio of the norbornene-based polymer is preferably 0.03% by weight or less, further preferably 0.02% by weight or less, and particularly preferably 0.01% by weight or less. When the saturated water absorption ratio falls within the aforementioned range, time-dependent changes in optical characteristics such as a retardation of the optical film can be reduced. Further, deterioration of a member (polarizing plate etc.) and a device (liquid crystal display device etc.) that have the optical film can be suppressed, and lifetime extension of these member and device can be achieved.

The saturated water absorption ratio is a value represented by a percentage of the weight which increased after the sample was immersed in water at a certain temperature for a certain period of time relative to the weight of the test piece before the immersion. Usually, the measurement is performed after a sample was immersed in water at 23° C. for 24 hours. The saturated water absorption ratio of a polymer may be adjusted within the aforementioned range, by, for example, decreasing the amount of a polar group in the polymer. Therefore, from the viewpoint of reducing the saturated water absorption ratio, it is preferable that the norbornene-based polymer does not have a polar group.

The amount of the norbornene-based polymer in the norbornene-based resin is preferably 50.0% by weight to 100% by weight, more preferably 80.0% by weight to 100% by weight, and particularly preferably 90.0% by weight to 100% by weight. When the amount of the norbornene-based polymer falls within the aforementioned range, an excellent optical film can be obtained taking advantage of characteristics such as heat resistance, moisture resistance, transparency, mechanical strength, size stability, and moldability of the norbornene-based polymer.

The norbornene-based resin may further contain an optional component, in addition to the norbornene-based polymer described above. Examples of the optional component may include compounding agents such as: a coloring agent such as a pigment and a dye; a plasticizer; a fluorescent brightener; a dispersant; a thermal stabilizer; a photostabilizer; an antistatic agent; a ultraviolet ray absorber; an antioxidant; and a surfactant. As the optional component, one type thereof may be solely used, and two or more types thereof may also be used in combination at any ratio.

The glass transition temperature of the norbornene-based resin is preferably 100° C. or higher, more preferably 110° C. or higher, and particularly preferably 120° C. or higher, and is preferably 160° C. or lower, more preferably 150° C. or lower, and particularly preferably 140° C. or lower. When the glass transition temperature of the norbornene-based resin is equal to or more than the lower limit value of the aforementioned range, the durability of the optical film in a high-temperature environment can be enhanced. When the glass transition temperature is equal to or less than the upper limit value of the aforementioned range, the optical film can be easily produced.

As the optical film has the second layer containing the norbornene-based polymer as described above, the optical film can exhibit excellent properties that are the same as those of the prior-art film containing the norbornene-based polymer in terms of characteristics such as transparency and modulus of elongation. Further, the optical film can usually exhibit excellent properties that are the same as those of the prior-art film containing the norbornene-based polymer also in terms of characteristics such as heat resistance, moisture resistance, size stability, and moldability.

The thickness of the second layer is preferably 5 μm or more, and more preferably 10 μm or more, and is preferably 200 μm or less, and more preferably 100 μm or less. When the thickness of the second layer is equal to or more than the lower limit value of the aforementioned range, the modulus of elasticity and heat resistance of the entire optical film can be maintained. When the thickness is equal to or less than the upper limit value of the aforementioned range, the bending resistance can be further improved.

[4. Third Layer]

The third layer contains a hydrogenated product of an aromatic vinyl compound-conjugated diene compound block copolymer. Therefore, the third layer is usually a resin layer formed of a hydrogenated polymer resin containing the hydrogenated product of the aromatic vinyl compound-conjugated diene compound block copolymer.

As the hydrogenated polymer resin contained in the third layer, the hydrogenated polymer resins that have been described as the hydrogenated polymer resin contained in the first layer may be optionally used. The hydrogenated polymer resin contained in the first layer and the hydrogenated polymer resin contained in the third layer may be different. However, it is preferable that the hydrogenated polymer resins are the same from the viewpoint of suppressing the production cost and curling of the optical film.

The thickness of the third layer may be optionally set within the range of the thickness described as the thickness of the first layer. The thickness of the first layer and the thickness of the third layer may be different, but it is preferable that the thicknesses are the same from the viewpoint of suppressing the curling of the optical film.

[5. Optional Layer]

The optical film may have an optional layer in combination with the first, second, and third layers, as long as the effects of the present invention are not significantly impaired. It is preferable that the optical film is a film of a three-layer structure having first, second, and third layers from the viewpoint of decreasing the thickness of the optical film.

[6. Properties and Size of Optical Film]

The optical film described above has excellent bending resistance. Therefore, the optical film is hardly damaged even when it is used in an application accompanying bending motion. The bending resistance of the optical film may be evaluated by folding endurance. The folding endurance of the optical film is usually 500 or more, preferably 1,000 or more, and more preferably 1,500 or more. The upper limit of folding endurance of the optical film is not particularly limited, and for example, may be 1,000,000 or less.

The folding endurance of the optical film may be measured by the following procedure by an MIT folding test according to JIS P 8115 "paper and board-determination of folding endurance-MIT tester method".

The optical film as a sample is cut out to obtain a test piece having a width of 15 mm±0.1 mm and a length of about 110 mm. When the optical film is a film produced through a stretching treatment, the test piece is produced so that a direction in which the film is the most strongly stretched is parallel to a side with a length of about 110 mm of the test piece. The aforementioned test piece is then bent by an MIT folding endurance tester ("No. 307" manufactured by YASUDA SEIKI SEISAKUSHO, LTD.) under conditions of a load of 9.8 N, a curvature of bending portion of 0.38±0.02 mm, a bending angle of 135°±2°, and a bending rate of 175 times/min in a manner such that a folding line appears in a widthwise direction of the test piece. The bending is continued, and the number of reciprocating bendings until the test piece is ruptured is measured.

Ten test pieces are produced, and the number of reciprocating bendings until each test piece is ruptured is measured ten times by the aforementioned method. The average of ten measured values is adopeted as the folding endurance (MIT fold number) of the optical film.

The optical film described above has excellent characteristics that are the same as the prior-art film containing the norbornene-based polymer. For example, the optical film of the present invention has excellent transparency and mechanical strength.

Specifically, the total light transmittance of the optical film is preferably 70% to 100%, more preferably 80% to 100%, and particularly preferably 90% to 100%. The total light transmittance of the optical film may be measured at a wavelength range of 400 nm to 700 nm by an ultraviolet-visible spectrophotometer.

The modulus of elongation of the optical film is preferably 1,000 MPa or more, more preferably 1,400 or more, and particularly preferably 1,600 or more. The modulus of elongation of the optical film may be measured according to JIS K 7161. The upper limit of modulus of elongation of the optical film is not particularly limited, and for example, may be 5,000 MPa or less.

The amount of volatile component contained in the optical film is preferably 0.1% by weight or less, more preferably 0.05% by weight or less, and further preferably 0.02% by weight or less. When the amount of the volatile component falls within the aforementioned range, the size stability of the optical film body can be improved, and time-dependent changes in optical characteristics such as retardation can be reduced. Further, deterioration of a member (polarizing plate etc.) and a device (image display device etc.) that have the optical film can be suppressed, and lifetime extension of these member and the device can be achieved. Herein, the volatile component is a substance having a molecular weight of 200 or less. Examples of the volatile component may include a residual monomer and a solvent. The amount of the volatile component may be quantified as the total amount of the substance having a molecular weight of 200 or less, by analysis through gas chromatography.

It is preferable that the optical film has a thin thickness. Even when the optical film has such a thin thickness, the optical film described above has high resistance bending. Specifically, the thickness of the optical film is preferably 5 μm or more, and more preferably 10 μm or more, and is preferably 200 μm or less, and more preferably 100 μm or less.

The water absorption ratio of the optical film is preferably 0.1% by weight or less, more preferably 0.05% by weight or less, and further preferably 0.01% by weight or less. The ideal water absorption ratio is 0% by weight. When the water absorption ratio falls within this range, lifetime extension of the member (polarizing plate etc.) and the device (image display device etc.) that have the optical film can be achieved. The lower limit of water absorption ratio is not particularly limited, and is ideally 0% by weight. The water absorption ratio of the optical film is a value measured in accordance with ASTM D570. Specifically, the water absorption ratio may be determined by immersing a film of 100 mm×100 mm in water at 23° C. for 1 hour and measuring the increased amount of the weight as a result of the immersion.

[7. Method for Producing Optical Film]

The method for producing the optical film is not limited. For example, the optical film may be produced by a method including a step of molding the hydrogenated polymer resin and the norbornene-based resin into a film shape.

Examples of the method for molding the resins may include a coextrusion method and a cocasting method. Among these molding methods, a coextrusion method is preferable, because it is excellent in production efficiency and is not likely to cause a volatile component to remain in the optical film.

The coextrusion method includes an extrusion step of coextruding the hydrogenated polymer resin and the norbornene-based resin. In the extrusion step, each of the hydrogenated polymer resin and the norbornene-based resin is extruded into a layer shape in a melted state. Examples of the extrusion method of the resins may include a coextrusion T die method, a coextrusion inflation method, and a coextrusion lamination method. Among these, a coextrusion T die method is preferable. The coextrusion T die method includes a feed block system and a multi-manifold system, and a multi-manifold system is particularly preferable in terms of smaller fluctuation in thickness.

In the extrusion step, the melting temperature of the resins to be extruded is preferably (Tg+80° C.) or higher, and more preferably (Tg+100° C.) or higher, and is preferably (Tg+180° C.) or lower, and more preferably (Tg+170° C.) or lower. As described herein, "Tg" represents the highest temperature among the glass transition temperatures of the hydrogenated polymer resin and the norbornene-based resin. When the melting temperature of the resins to be extruded is equal to or more than the lower limit value of the aforementioned range, the fluidity of the resins can be sufficiently enhanced, thereby to achieve favorable molding properties. Also, when the melting temperature is equal to or lower than the upper limit value, the deterioration of the resins can be suppressed.

In the extrusion step, the temperature of the resins in an extruder is preferably Tg to (Tg+100° C.) at a resin charging inlet, and preferably (Tg+50° C.) to (Tg+170° C.) at an outlet of an extruder. The die temperature is preferably (Tg+50° C.) to (Tg+170° C.)

In the coextrusion method, melted resins in film shape extruded through a die are usually brought into intimate contact with a cooling roll for cooling, so that the resins are cured. Examples of the method for bringing melted resins into intimate contact with a cooling roll in this step may include an air knife system, a vacuum box system, and an electrostatic adhesion system.

The number of cooling rolls is not particularly limited, and is usually two or more. Examples of the method of disposing the cooling rolls may include straight line-type, Z-type, and L-type. In this step, the method of guiding the melted resins extruded through a die to the cooling rolls is not particularly limited.

As a result of molding of the hydrogenated polymer resin and the norbornene-based resin into a film shape as described above, the optical film having the first layer formed of the hydrogenated polymer resin, the second layer formed of the norbornene-based resin, and the third layer formed of the hydrogenated polymer resin in this order is obtained.

The method for producing the optical film may further include an optional step in addition to the aforementioned steps.

For example, the method for producing the optical film may include a step of stretching the optical film. When the optical film is stretched, a desired retardation can be expressed in the optical film, and the mechanical characteristics of the optical film can be improved.

For example, the method for producing the optical film may include a step of surface-treating the optical film.

[8. Applications of Optical Film]

The optical film is used for any application.

Examples of the application of the optical film may include a phase difference film, a film for protecting a polarizing plate, a sealing film for an optical device, a substrate film for an organic electroluminescent element, a substrate film for a flexible electrode, and a substrate film for a touch panel.

EXAMPLES

Hereinafter, the present invention will be specifically described with reference to Examples. However, the present invention is not limited to the following Examples. The present invention may be freely modified and implemented without departing from the scope of claims of the present invention and the scope of their equivalents.

Unless otherwise stated, "%" and "part" representing an amount in the following description are on the basis of weight. Unless otherwise stated, the operations described below were performed at a normal temperature and normal pressure in an atmospheric air.

[Evaluation Method]

[Method for Measuring Modulus of Elongation]

The modulus of elongation of the optical film was measured in accordance with JIS K 7161.

[Method for Evaluating Folding Endurance]

The folding endurance of an optical film was measured in the following procedure by an MIT folding test according to JIS P 8115 "paper and board—determination of folding endurance-MIT tester method".

The optical film as a sample was cut out to obtain a test piece having a width of 15 mm±0.1 mm and a length of about 110 mm. The aforementioned test piece was bent by an MIT folding endurance tester ("No. 307" manufactured by YASUDA SEIKI SEISAKUSHO, LTD.) under conditions of a load of 9.8 N, a curvature of bending portion of 0.38±0.02 mm, a bending angle of 135°±2°, and a bending rate of 175 times/min in a manner such that a folding line appears in a widthwise direction of the test piece. The bending was continued, and the number of reciprocating bendings until the test piece was ruptured was measured.

Ten test pieces were produced, and the number of reciprocating bendings until each test piece was ruptured was measured ten times in accordance with the aforementioned method. The average of ten measured values was adopted as the folding endurance (MIT fold number) of the film.

[Method for Measuring Total Light Transmittance]

The total light transmittance of the optical film was measured at a wavelength range of 400 nm to 700 nm by an ultraviolet-visible spectrophotometer.

[Water Absorption Ratio]

The water absorption ratio of the optical film is a value measured in accordance with ASTM D570. Specifically, the water absorption ratio was determined by immersing a film of 100 mm×100 mm in water at 23° C. for 1 hour and measuring the increased amount of the weight as a result of the immersion.

Production Example 1

Production of Resin A (Production of Block Copolymer)

A reaction vessel equipped with a stirrer and inside air of which was sufficiently replaced with nitrogen was charged with 550 parts of dehydrated cyclohexane, 30.0 parts of dehydrated styrene, and 0.475 parts of n-dibutyl ether. While the entire volume was stirred at 60° C., 0.83 parts of n-butyl lithium (15% cyclohexane solution) was added to initiate polymerization. The polymerization was further performed for 60 minutes with stirring at 60° C. The reaction liquid was subjected to gas chromatography, and the polymerization conversion ratio at that time was measured to be 99.5%.

Subsequently, 40.0 parts of dehydrated isoprene was added to the reaction liquid, and the reaction liquid was continuously stirred at 60° C. for 30 minutes. The reaction liquid was subjected to gas chromatography, and the polymerization conversion ratio at that time was measured to be 99%.

Subsequently, 30.0 parts of dehydrated styrene was further added to the reaction liquid, and the entire volume was stirred at 60° C. for 60 minutes. The reaction liquid was subjected to gas chromatography, and the polymerization conversion ratio at that time was measured to be about 100%.

At that time, 0.5 parts of isopropyl alcohol was added to terminate the reaction. Thus, a polymer solution containing a block copolymer was obtained. The weight-average molecular weight (Mw) of the obtained block copolymer was 48,300, the molecular weight distribution (Mw/Mn) thereof was 1.03, and the ratio by weight of styrene block relative to isobutylene block was 60:40.

(Hydrogenation Reaction)

Subsequently, the aforementioned polymer solution was transferred to a pressure-resistant reaction vessel equipped with a stirrer, and then 4.0 parts of a nickel catalyst supported on a diatomaceous earth ("E22U" available from JGC Catalysts and Chemicals Ltd., nickel supported amount: 60%) as a hydrogenation catalyst and 100 parts of dehydrated cyclohexane were added and mixed. The inside air of the reaction vessel was replaced with a hydrogen gas. Further, supplying hydrogen while the solution was stirred, a hydrogenation reaction was performed at a temperature of 170° C. and a pressure of 4.5 MPa for 6 hours. The weight-average molecular weight (Mw) of the hydrogenated product of the block copolymer obtained by the hydrogenation reaction was 51,500, and the molecular weight distribution (Mw/Mn) thereof was 1.04.

(Formation of Pellets)

After completion of the hydrogenation reaction, the reaction liquid was filtered to remove the hydrogenation catalyst. Subsequently, to the filtrate, 1.0 part of a xylene solution in which 0.05 parts by weight of pentaerythrityl tetrakis[3-(3,5-di-t-butyl-4-hydroxyphenyl)propionate] ("Songnox1010" available from KOYO Chemical Research Center) as a phenol-based antioxidant was dissolved was added and dissolved. Subsequently, the aforementioned solution was filtered through Zeta Plus (registered trademark) filter 30H (available from CUNO, pore diameter: 0.5 μm to 1 μm), and then successively filtered through another filter made of metal fibers (available from NICHIDAI CORPORATION, pore diameter: 0.4 μm), to remove a minute solid content. Subsequently, the solvent cyclohexane and xylene, and other volatile components were removed from the solution using a cylindrical concentrating and drying device (Kontro, manufactured by Hitachi, Ltd.) at a temperature 260° C. and a pressure of 0.001 MPa or less. The residual solid content was extruded from a die directly connected to the concentrating and drying device into a strand shape in a melted state, cooled, and cut by a pelletizer, to obtain 95 parts of pellets containing the hydrogenated product of the block copolymer. The weight-average molecular weight (Mw) of the hydrogenated product of the block copolymer of the obtained pellets was 50,300, the molecular weight distribution (Mw/Mn) thereof was 1.05, and the hydrogenation ratio was about 100%. Hereinafter, the resin of the pellets is appropriately referred to as "resin A".

Production Example 2

Production of Resin B

A reaction vessel equipped with a stirrer and inside air of which was sufficiently replaced with nitrogen was charged with 550 parts of dehydrated cyclohexane, 45.0 parts of dehydrated styrene, and 0.475 parts of n-dibutyl ether. While the entire volume was stirred at 60° C., 0.83 parts of n-butyl lithium (15% cyclohexane solution) was added to initiate polymerization. The polymerization was further performed for 60 minutes with stirring at 60° C. The reaction liquid was subjected to gas chromatography, and the polymerization conversion ratio at that time was measured to be 99.5%.

Subsequently, 10.0 parts of dehydrated isoprene was added to the reaction liquid, and the reaction liquid was continuously stirred at 60° C. for 30 minutes. The reaction liquid was subjected to gas chromatography, and the polymerization conversion ratio at that time was measured to be 99%.

Subsequently, 45.0 parts of dehydrated styrene was further added to the reaction liquid, and the entire volume was stirred at 60° C. for 60 minutes. The reaction liquid was subjected to gas chromatography, and the polymerization conversion ratio at that time was measured to be about 100%.

At that time, 0.5 parts of isopropyl alcohol was added to terminate the reaction. Thus, a polymer solution containing a block copolymer was obtained. The weight-average molecular weight (Mw) of the obtained block copolymer was 50,400, the molecular weight distribution (Mw/Mn) thereof was 1.03, and the ratio by weight of styrene block relative to isobutylene block was 90:10.

The obtained block copolymer was subjected to a hydrogenation reaction in the same manner as in Production Example 1. The weight-average molecular weight (Mw) of the hydrogenated product of the block copolymer obtained by the hydrogenation reaction was 53,000, and the molecular weight distribution (Mw/Mn) thereof was 1.04.

With the obtained hydrogenated product of the block copolymer, pellets were formed in the same manner as in Production Example 1. The weight-average molecular weight (Mw) of the hydrogenated product of the block copolymer of the obtained pellets was 52,200, the molecular weight distribution (Mw/Mn) thereof was 1.05, and the hydrogenation ratio was about 100%. Hereinafter, the resin of the pellets is appropriately referred to as "resin B".

Production Example 3

Production of Resin C

A reaction vessel equipped with a stirrer and inside air of which was sufficiently replaced with nitrogen was charged with 550 parts of dehydrated cyclohexane, 37.5 parts of dehydrated styrene, and 0.475 parts of n-dibutyl ether. While the entire volume was stirred at 60° C., 0.83 parts of n-butyl lithium (15% cyclohexane solution) was added to initiate polymerization. The polymerization was further performed for 60 minutes with stirring at 60° C. The reaction liquid was subjected to gas chromatography, and the polymerization conversion ratio at that time was measured to be 99.5%.

Subsequently, 25.0 parts of dehydrated isoprene was added to the reaction liquid, and the reaction liquid was continuously stirred at 60° C. for 30 minutes. The reaction liquid was subjected to gas chromatography, and the polymerization conversion ratio at that time was measured to be 99%.

Subsequently, 37.5 parts of dehydrated styrene was further added to the reaction liquid, and the entire volume was stirred at 60° C. for 60 minutes. The reaction liquid was subjected to gas chromatography, and the polymerization conversion ratio at that time was measured to be about 100%.

At that time, 0.5 parts of isopropyl alcohol was added to terminate the reaction. Thus, a polymer solution containing a block copolymer was obtained. The weight-average molecular weight (Mw) of the obtained block copolymer was 54,000, the molecular weight distribution (Mw/Mn) thereof was 1.04, and the ratio by weight of styrene block relative to isobutylene block was 75:25.

The obtained block copolymer was subjected to a hydrogenation reaction in the same manner as in Production Example 1. The weight-average molecular weight (Mw) of the hydrogenated product of the block copolymer obtained by the hydrogenation reaction was 53,100, and the molecular weight distribution (Mw/Mn) thereof was 1.04.

With the obtained hydrogenated product of the block copolymer, pellets were formed in the same manner as in Production Example 1. The weight-average molecular weight (Mw) of the hydrogenated product of the block copolymer of the obtained pellets was 52,500, the molecular weight distribution (Mw/Mn) thereof was 1.05, and the hydrogenation ratio was about 100%. Hereinafter, the resin of the pellets is appropriately referred to as "resin C".

Production Example 4

Production of Resin D

A reaction vessel equipped with a stirrer and inside air of which was sufficiently replaced with nitrogen was charged with 550 parts of dehydrated cyclohexane, 47.5 parts of dehydrated styrene, and 0.475 parts of n-dibutyl ether. While the entire volume was stirred at 60° C., 0.83 parts of n-butyl lithium (15% cyclohexane solution) was added to initiate polymerization. The polymerization was further performed for 60 minutes with stirring at 60° C. The reaction liquid was subjected to gas chromatography, and the polymerization conversion ratio at that time was measured to be 99.5%.

Subsequently, 5.0 parts of dehydrated isoprene was added to the reaction liquid, and the reaction liquid was continuously stirred at 60° C. for 30 minutes. The reaction liquid was subjected to gas chromatography, and the polymerization conversion ratio at that time was measured to be 99%.

Subsequently, 47.5 parts of dehydrated styrene was further added to the reaction liquid, and the entire volume was stirred at 60° C. for 60 minutes. The reaction liquid was subjected to gas chromatography, and the polymerization conversion ratio at that time was measured to be about 100%.

At that time, 0.5 parts of isopropyl alcohol was added to terminate the reaction. Thus, a polymer solution containing a block copolymer was obtained. The weight-average molecular weight (Mw) of the obtained block copolymer was 54,000, the molecular weight distribution (Mw/Mn) thereof was 1.04, and the ratio by weight of styrene block relative to isobutylene block was 95:5.

The obtained block copolymer was subjected to a hydrogenation reaction in the same manner as in Production Example 1. The weight-average molecular weight (Mw) of the hydrogenated product of the block copolymer obtained by the hydrogenation reaction was 53,000, and the molecular weight distribution (Mw/Mn) thereof was 1.04.

With the obtained hydrogenated product of the block copolymer, pellets were formed in the same manner as in Production Example 1. The weight-average molecular weight (Mw) of the hydrogenated product of the block copolymer of the obtained pellets was 52,200, the molecular weight distribution (Mw/Mn) thereof was 1.05, and the hydrogenation ratio was about 100%. Hereinafter, the resin of the pellets is appropriately referred to as "resin D".

Example 1

A three-type three-layer film molding device for co-extrusion molding having three uniaxial extruders a, b, and c with double-flight-type screws was prepared. Herein, the three-type three-layer film molding device is a film molding device that is capable of producing a film having a three-layer structure from three types of resins. The film molding device used in this Example was provided so as to be capable of producing a film having a layer of a resin supplied to the uniaxial extruder a, a layer of a resin supplied to the uniaxial stretching device b, and a layer of a resin supplied to the uniaxial stretching device c in this order.

The pellets of the resin A were supplied to the uniaxial extruders a and c. Pellets of a norbornene-based resin ("ZEONOR 1600" available from ZEON Corporation) were supplied to the uniaxial extruder b. Subsequently, the resins supplied to the uniaxial stretching devices a, b, and c were each melted at an extrusion temperature of 260° C.

The melted resin A and the norbornene-based resin were supplied to a multi-manifold die through a leaf disc-shaped polymer filter having an opening of 10 μm and simultaneously extruded from the multi-manifold die at 260° C. into a film shape. The melted resin extruded into the film shape was casted onto a cooling roller having a surface temperature adjusted to 100° C., and then passed through two cooling rollers having a surface temperature adjusted to 50° C. Thus, an optical film having a first layer (thickness: 5 μm) formed of the resin A, a second layer (thickness: 40 μm) formed of the norbornene-based resin, and a third layer (thickness: 5 μm) formed of the resin A in this order and a thickness of 50 μm was obtained.

The obtained optical film was evaluated by the aforementioned methods.

Example 2

An optical film was produced and evaluated in the same manner as in Example 1 except that the resin B was used in place of the resin A.

Example 3

An optical film was produced and evaluated in the same manner as in Example 1 except that the resin C was used in place of the resin A.

Example 4

An optical film was produced and evaluated in the same manner as in Example 1 except that the resin D was used in place of the resin A.

Comparative Example 1

An optical film having a single-layer structure having only a layer formed of a norbornene-based resin was produced and evaluated in the same manner as in Example 1 except that the norbornene-based resin was used in place of the resin A.

Comparative Example 1

An optical film having a single-layer structure having only a layer formed of the resin A was produced and evaluated in the same manner as in Example 1 except that the resin A was used in place of the norbornene-based resin.

[Results]

The results in Examples and Comparative Examples described above are shown in the following Table 1. Abbreviations in Table 1 mean as follows.

St/IP ratio: Ratio by weight of styrene relative to isoprene in hydrogenated product of aromatic vinyl compound-conjugated diene compound block copolymer (styrene/isoprene)

ZNR: norbornene-based resin

Elastic modulus: modulus of elongation of optical film

Transmittance: total light transmittance of optical film

TABLE 1

Results of Examples and Comparative Examples

| | First layer and third layer | | | Second layer | | Total | | Evaluation results | | |
| --- | --- | --- | --- | --- | --- | --- | --- | --- | --- | --- |
| | Material | Thickness (μm) | St/IP ratio | Material | Thickness (μm) | thickness (μm) | Folding endurance | Elastic modulus (MPa) | Transmittance (%) | Water absorption ratio (wt %) |
| Ex. 1 | Resin A | 5 | 60/40 | ZNR | 40 | 50 | 1836 | 1800 | 92 | <0.01 |
| Ex. 2 | Resin B | 5 | 90/10 | ZNR | 40 | 50 | 1221 | 2000 | 92 | <0.01 |

TABLE 1-continued

Results of Examples and Comparative Examples

| | First layer and third layer | | | Second layer | | Total | Evaluation results | | | Water |
|---|---|---|---|---|---|---|---|---|---|---|
| | Material | Thickness (μm) | St/IP ratio | Material | Thickness (μm) | thickness (μm) | Folding endurance | Elastic modulus (MPa) | Transmittance (%) | absorption ratio (wt %) |
| Ex. 3 | Resin C | 5 | 75/25 | ZNR | 40 | 50 | 1701 | 1850 | 92 | <0.01 |
| Ex. 4 | Resin D | 5 | 95/5 | ZNR | 40 | 50 | 529 | 2050 | 92 | <0.01 |
| Comp. Ex. 1 | — | — | — | ZNR | 50 | 50 | 337 | 2100 | 92 | <0.01 |
| Comp. Ex. 2 | — | — | — | Resin A | 50 | 50 | 5230 | 600 | 92 | <0.01 |

[Discussion]

As seen from Table 1, the optical films in Examples 1 to 4 have strong folding endurance, low water absorption ratio, and excellent modulus of elongation and total light transmittance. Therefore, it is confirmed that the present invention can achieve an optical film having excellent bending resistance in addition to the characteristics that are the same as those of the prior-art film formed of a norbornene-based resin.

The invention claimed is:

1. An optical film comprising, in this order:
   a first layer containing a hydrogenated product of an aromatic vinyl compound-conjugated diene compound block copolymer;
   a second layer containing a norbornene-based polymer; and
   a third layer containing a hydrogenated product of an aromatic vinyl compound-conjugated diene compound block copolymer,
   wherein a ratio of a thickness of the first layer relative to a thickness of the second layer (first layer/second layer) is 5/95 or more and 60/40 or less,
   wherein the aromatic vinyl compound-conjugated diene compound block copolymer contains a polymer block [A] containing an aromatic vinyl compound unit and a polymer block [B] containing a conjugated diene compound unit,
   wherein a number of the polymer block [A] in one molecule of the aromatic vinyl compound-conjugated diene compound block copolymer is 2 or more, and
   wherein a ratio of the conjugated diene compound unit in the polymer block [B] is 90% to 100% by weight.

2. The optical film according to claim 1, wherein the hydrogenated product of the aromatic vinyl compound-conjugated diene compound block copolymer is a hydrogenated product of a styrene-isoprene copolymer.

3. The optical film according to claim 2, wherein a copolymerization ratio of styrene/isoprene in the hydrogenated product of the styrene-isoprene copolymer is 50/50 to 90/10.

4. The optical film according to claim 1, wherein a water absorption ratio measured in accordance with ASTM D570 is 0.1% by weight or less.

5. The optical film according to claim 2, wherein a water absorption ratio measured in accordance with ASTM D570 is 0.1% by weight or less.

6. The optical film according to claim 3, wherein a water absorption ratio measured in accordance with ASTM D570 is 0.1% by weight or less.

* * * * *